United States Patent
Goto et al.

(10) Patent No.: US 8,642,118 B2
(45) Date of Patent: Feb. 4, 2014

(54) PATTERN ELECTRODE MANUFACTURING METHOD AND PATTERN ELECTRODE

(75) Inventors: Masaki Goto, Hino (JP); Akihiko Takeda, Sagamihara (JP); Kazuaki Nakamura, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 219 days.

(21) Appl. No.: 13/144,412

(22) PCT Filed: Dec. 18, 2009

(86) PCT No.: PCT/JP2009/071122
§ 371 (c)(1),
(2), (4) Date: Jul. 13, 2011

(87) PCT Pub. No.: WO2010/082429
PCT Pub. Date: Jul. 22, 2010

(65) Prior Publication Data
US 2011/0272176 A1 Nov. 10, 2011

(30) Foreign Application Priority Data
Jan. 16, 2009 (JP) ................................ 2009-007392

(51) Int. Cl.
*B05D 5/12* (2006.01)
*B05D 3/00* (2006.01)

(52) U.S. Cl.
USPC ......... 427/99.2; 427/98.4; 427/271; 427/273; 427/337; 427/352

(58) Field of Classification Search
USPC .......... 427/77, 98.4, 99.2, 271, 273, 337, 352
See application file for complete search history.

(56) References Cited

U.S. PATENT DOCUMENTS

| 4,443,495 A * | 4/1984 | Morgan et al. ............... 427/98.4 |
| 6,988,925 B2 * | 1/2006 | Arthur et al. ..................... 445/46 |
| 8,018,568 B2 * | 9/2011 | Allemand et al. ............ 349/187 |
| 2005/0196707 A1 | 9/2005 | Cok |
| 2007/0074316 A1 | 3/2007 | Alden et al. |
| 2008/0143906 A1 | 6/2008 | Allemand et al. |
| 2008/0259262 A1 | 10/2008 | Jones et al. |

FOREIGN PATENT DOCUMENTS

| CN | 101589473 A | 11/2009 |
| EP | 1104791 A1 | 6/2001 |
| EP | 2082436 A2 | 7/2009 |
| EP | 2147466 A1 | 1/2010 |
| JP | 2003-515622 A | 5/2003 |
| JP | 2008-13798 A | 1/2008 |
| WO | 01/39135 A2 | 5/2001 |
| WO | 2008/046058 A2 | 4/2008 |

OTHER PUBLICATIONS

"Technology of Transparent Conductive Thin-Films", p. 81 edited by Nippon Gakujutu Shinkokai Tomeisankabutu Hikari-Denshi Zairyo Dai 166 Iinkai, published Dec. 20, 2006.
International Search Report for International Application No. PCT/JP2009/071122 mailed Mar. 23, 2010 with English translation.
"Technology of Transparent Conductive Film", p. 80, published by Ohmsha, Ltd., 1999 (with English translation).

\* cited by examiner

*Primary Examiner* — Brian K Talbot
(74) *Attorney, Agent, or Firm* — Cantor Colburn LLP

(57) ABSTRACT

The present invention can easily provide a method of manufacturing a pattern electrode with excellent electroconductivity and excellent transparency and a pattern electrode manufactured according to the method. The method of manufacturing a pattern electrode is characterized in that it comprises the steps of forming on a substrate an electroconductive layer containing metal nanowires, and carrying out pattern printing on the electroconductive layer employing a metal nanowire removing solution, followed by washing with water.

12 Claims, No Drawings

PATTERN ELECTRODE MANUFACTURING METHOD AND PATTERN ELECTRODE

This is a U.S. national stage application of International Application No. PCT/JP2009/071122, filed on Dec. 18, 2009. Priority under 35 U.S.C. 119(a) and 35 U.S.C. 365(b) is claimed from Japanese Application No. JP 2009-007392, filed Jan. 16, 2009, the disclosure of which is also incorporated herein by reference.

TECHNICAL FIELD

This invention relates to a method of manufacturing a pattern electrode which excels in electroconductivity and transparency, and to a pattern electrode which excels in electroconductivity and transparency.

TECHNICAL BACKGROUND

Heretofore, a film of various metals such as Au, Ag and Pt and Cu; a film of metal oxides such as indium oxide doped with tin or zinc (ITO or IZO), zinc oxide doped with aluminum or gallium (AZO or GZO) and tin oxide doped with fluorine or antimony (PTO or ATO); a conductive film of nitrides such as TiN, ZrN and HfN and a conductive film of borides such as $LaB_6$ and the like are well-known as transparent conductive electrodes, and further, various electrodes including a combination thereof such as $Bi_2O_3/Au/Bi_2O_3$ and $TiO_2/Ag/TiO_2$ and the like are well-known. In addition to the transparent electrodes described above, a transparent electrode employing CNT (carbon nanotube) or a conductive polymer has been also proposed (for example, refer to Non-Patent Document 1).

However, the films of metals, nitrides or borides described above and a conductive polymer film are utilized only in a specific technological field such as electromagnetic wave shielding or in a touch panel field when even a relatively high resistance is acceptable, since high optical transparency and high electroconductivity are incompatible.

On the other hand, a metal oxide film is predominantly utilized as a transparent electrode, since it has excellent durability and compatibility between high optical transparency and high electroconductivity. Particularly, ITO is often utilized as a transparent electrode for various optoelectronics application, since it has good balance between optical transparency and electroconductivity, and can easily form a fine electrode pattern according to a wet process employing a solution as well as a vacuum process such as sputtering. However, the vacuum process such as sputtering requires expensive equipment in order to form a transparent conductive film, while the wet process requires annealing treatment at high temperature of 500° C. or higher in order to obtain high electroconductivity.

Besides the transparent electrodes described above, there is proposed a transparent electrode with fine meshes composed of metal nanowires (for example, refer to Patent Document 1). Particularly, metal nanowires employing silver provide compatibility between high electroconductivity and high transparency, due to high electrical conductivity that silver itself has.

As a method of forming a transparent electrode pattern employing metal nanowires, there are mentioned a method employing a printing ink containing electroconductive microwires (for example, refer to Patent Document 2) and a method forming a nanowire pattern according to photolithography (for example, refer to Patent Documents 3 and 4).

However, in any methods as described above, electroconductivity lowers due to increase of contact resistance between the metal nanowires caused by a binder, and further, removal of the resist penetrating in the fine metal nanowire meshes may be insufficient, resulting in lowering of light transmittance, and on removal of the resist, metal nanowires are released. As described above, a conventional pattern formation method is not satisfactory.

PRIOR ART LITERATURES

Patent Documents

Patent Document 1: US Patent Publication No. 2007/0074316
Patent Document 2: Japanese Unexamined Patent Application Publication (Translation of PCT Application) No. 2003-515622
Patent Document 3: US Patent Publication No. 2005/0196707
Patent Document 4: US Patent Publication No. 2008/0143906

Non-Patent Documents

Non-Patent Document 1: "Technologies of Transparent Conductive Film", p. 80, published by Ohmsha, Ltd.).

DISCLOSURE OF THE INVENTION

Problems to be Solved by the Invention

This invention has been made in view of the above. An object of the invention is to provide a method of manufacturing a pattern electrode which excels in electroconductivity and transparency, and to provide a pattern electrode manufactured according to the method.

Means for Solving the Above Problems

The present invention has been attained by any one of the following constitutions.

1. A method of manufacturing a pattern electrode, the method comprising the steps of forming on a substrate an electroconductive layer containing metal nanowires, and carrying out pattern printing on the electroconductive layer employing a metal nanowire removing solution, followed by washing with water.
2. The method of manufacturing a pattern electrode of item 1 above, wherein the metal nanowires are silver nanowires.
3. The method of manufacturing a pattern electrode of item 1 or 2 above, wherein the metal nanowire removing solution comprises a bleach-fixing solution.
4. The method of manufacturing a pattern electrode of any one of items 1 through 3 above, wherein the metal nanowire removing solution contains a water soluble binder.
5. The method of manufacturing a pattern electrode of any one of items 1 through 4 above, wherein the pattern printing is carried out employing a gravure printing method.
6. The method of manufacturing a pattern electrode of any one of items 1 through 4 above, wherein the pattern printing is carried out employing a screen printing method.
7. A pattern electrode manufactured according to the method of manufacturing a pattern electrode of any one of items 1 through 6 above.

Effects of the Invention

The present invention can easily provide a method of manufacturing a pattern electrode with excellent electroconductivity and excellent transparency and a pattern electrode manufactured according to the method.

PREFERRED EMBODIMENT OF THE INVENTION

Next, the present invention and the constituent elements will be explained in detail below.

[Electroconductive Layer]

The electroconductive layer in the invention is characterized in that it contains metal nanowires. The method of forming the electroconductive layer in the invention is not specifically limited, as long as it is a liquid phase layer formation method in which a dispersion solution containing metal nanowires is coated on a substrate and dried to form a layer. As the coating method is preferably employed a coating method such as a roller coating method, a bar coating method, a dip coating method, a spin coating method, a casting method, a die coating method, a blade coating method, a bar coating method, a gravure coating method, a curtain coating method, a spray coating method or a doctor coating method. Further, an electroconductive layer containing a conductive polymer or a metal oxide or a binder resin layer may be provided as necessary, and the electroconductive layer may be formed on another substrate by transfer.

[Metal Nanowire]

Generally, metal nanowire refers to a fibrous substance which is composed of a metallic element as a main constituent. Specifically, the metal nanowires in the invention refer to a large number of fibrous substances with a short axis length of from an atomic scale to a nanometer size.

In order to form a long conductive path by one metal nanowire, the metal nanowires in the invention have an average length of preferably not less than 3 µm, more preferably from 3 to 500 µm, and still more preferably from 3 to 300 µm. In addition, the relative standard deviation of the length of the metal nanowires is preferably 40% or less. Moreover, the average short axis length of the metal nanowires is not specifically limited. The smaller average short axis length is preferred from a viewpoint of transparency, but on the other hand, the larger average short axis length is preferred from a viewpoint of electroconductivity. In the invention, the average short axis length of the metal nanowires is preferably from 10 to 300 nm and more preferably from 30 to 200 nm. In addition, the relative standard deviation of the short axis length of the metal nanowires is preferably 20% or less.

As the metal used in the metal nanowires in the invention, there are mentioned copper, iron, cobalt, gold, and silver. Silver is preferred in view of its electroconductivity. A metal used in the metal nanowires in the invention may be used singly, however, in order to secure excellent electroconductivity and stability (resistance to sulfurization or oxidation of the metal nanowires and resistance to migration of the metal nanowires), the metal nanowires may contain a mixture of a metal as a main component and one or more of other metals in an arbitrary amount ratio.

In the present invention, there is no restriction in particular to a metal nanowire manufacturing method. It is possible to manufacture metal nanowires via well-known methods such as a liquid phase method or a gas phase method. The concrete manufacturing method is not specifically limited, and a conventional method can be applied. For example, the manufacturing method of silver nanowires may be referred to Adv. Mater., 2002, 14, 833-837 and Chem. Mater., 2002, 14, 4736-4745; the manufacturing method of gold nanowires may be referred to Japanese Patent O.P.I. Publication No. 2006-233252 and the like; the manufacturing method of copper nanowires may be referred to Japanese Patent O.P.I. Publication No. 2002-266007 and the like; and the manufacturing method of cobalt nanowires may be referred to Japanese Patent O.P.I. Publication No. 2004-149871. Particularly, the manufacturing method of silver nanowires as described above can be preferably applied as the manufacturing method of silver nanowires in the present invention, since silver nanowires can be easily manufactured in an aqueous solution and the electrical conductivity of silver is highest of all metals.

[Metal Nanowire Removing Solution]

The metal nanowire removing solution used in the invention is not specifically limited as long as it can remove metal nanowires. As the metal nanowire removing solution, a bleach fixing solution used in development treatment of a silver halide color photographic light sensitive material is preferably employed. The metal nanowire removing solution is preferably an aqueous solution, however, it may be a solution of an organic solvent such as ethanol, as long as the organic solvent can dissolve a beaching agent or a fixing agent as described later.

As the bleaching agent used in the bleach fixing solution, well-known bleaching agents are usable. As the bleaching agents, an organic complex salt of iron (III) (for example, an iron (III)-aminopolycarboxylic acid complex salt, an organic acid such as citric acid, tartaric acid, malic acid or the like, a persulfate and hydrogen peroxide are preferred.

Among these, an organic complex salt of iron (III) is especially preferred in view of the acceleration of processing and prevention of environmental pollution. Examples of an aminopolycarboxylic acid or its salt useful to form an organic complex salt of iron (III) include biodegradable ethylenediamine disuccinic acid (an SS isomer), N-(2-carboxylatoethyl)-L-aspartic acid, β-alanine diacetic acid, methylimino diacetic acid, ethylenediamine tetraacetic acid, diethylenetriamine pentaacetic acid, 1,3-diaminopropane tetraacetic acid, propylenediamine tetraacetic acid, nitrilotriacetic acid, cyclohexanediamine tetraacetic acid, imino diacetic acid, glycol ether diamine tetraacetic acid, and a compound represented by Formula (I) or (II) disclosed in EP Patent No. 0789275.

These compounds may be any of sodium, potassium, lithium, and an ammonium salt. With respect to ethylenediamine disuccinic acid (an SS isomer), N-(2-carboxylatoethyl)-L-aspartic acid, β-alanine diacetic acid, ethylenediamine tetraacetic acid, 1,3-diaminopropane tetraacetic acid, and a methylimino diacetic acid among the above compounds, their iron (III) complex salts are preferred. These ferric ion complex salts may be used in the form of the complex salts, or a ferric salt such as ferric sulfate, ferric chloride, ferric nitrate, ferric sulfate ammonium or ferric phosphate may be used together with a chelating agent such as aminopolycarboxylic acid to form a ferric ion complex salt in the solution. Further, the chelating agent may be used in an excessive amount more than that necessary to form a ferric complex salt. Among the iron complex salts, an iron-aminopolycarboxylic acid complex salt is preferred. The addition amount of the iron-aminopolycarboxylic acid complex salt is from 0.01 to 1.0 mol/liter, preferably from 0.05 to 0.50 mol/liter, more preferably from 0.10 to 0.50 mol/liter, and still more preferably from 0.15 to 0.40 mol/liter.

The fixing agent used in the bleach fixing solution is a known fixing agent, i.e., a water soluble silver halide solvent, for example, a thiosulfate such as sodium thiosulfate or ammonium thiosulfate; a thiocyanate such as sodium thiocyanate or ammonium thiocyanate; a thioether compound such as ethylene bisthioglycolic acid or 3,6-dithia-1,8-octane diol; or a thiourea. These fixing agents can be used singly or as an admixture of two or more kinds thereof. Further, a special bleach-fixing solution can be used which is comprised of a combination of a fixing agent disclosed in Japanese Patent O.P.I. Publication No. 55-155354 with a large amount of a halide such as potassium iodide. In the present invention, a thiosulfate, especially ammonium thiosulfate is preferred. The content of a fixing agent per one liter of the bleach-fixing solution is preferably from 0.3 to 2.0 mol, and more preferably from 0.5 to 1.0 mol.

The bleach-fixing solution used in the present invention has a pH of preferably from 3 to 8, and more preferably 4 to 7. In order to adjust the pH, hydrochloric acid, sulfuric acid, nitric acid, bicarbonate, ammonia, potassium hydroxide, sodium hydroxide, sodium carbonate or potassium carbonate may be added, if necessary.

In addition to a water soluble binder, various defoaming agents or surfactants, polyvinyl pyrrolidone or an organic solvent such as methanol can be contained in the bleach-fixing solution. It is preferred that the bleach-fixing solution contains, as a preserving agent, a sulfite ion releasing compound such as a sulfite (for example, sodium sulfite, potassium sulfite or ammonium sulfite); a bisulfite (for example, ammonium bisulfite, sodium bisulfite or potassium bisulfite) or a metabisulfite (for example, potassium metabisulfite, sodium metabisulfite or ammonium metabisulfite); or an arylsulfinic acid such as p-toluene sulfuric acid or m-carboxybenzene sulfuric acid. It is preferred that these compounds are contained in the bleach-fixing solution in an amount of from about 0.02 to 1.0 mol/liter in terms of a sulfite ion or a sulfinate ion.

Besides the compounds as described above, ascorbic acid, a carbonyl bisulfite adduct or a carbonyl compound may be added to the bleach-fixing solution as the preserving agent. Further, a buffering agent, a chelating agent, a defoaming agent or a mildew-proofing agent may be also added, if necessary.

[Water Soluble Binder]

As the water soluble binder in the invention, ethylene-vinyl alcohol copolymer, poly vinyl alcohol, sodium polyacrylate, or carbohydrates or their derivatives are preferably used. As the carbohydrates or their derivatives, there are mentioned water soluble cellulose derivatives and water soluble natural polymers. The water soluble cellulose derivatives refer to cellulose derivatives such as methylcellulose, hydroxyethylcellulose, and sodium carboxymethylcellulose (hereinafter also referred to as CMC). The water soluble natural polymers refer to starch, starch paste, soluble starch, and dextrin. Among these, CMC is preferred since it is highly soluble in water. The molecular weight of the water soluble binder in the invention can be arbitrarily selected according to viscosity to be required.

[Pattern Printing]

As a method of carrying out pattern printing employing the metal nanowire removing solution in the invention, there are printing methods such as a letterpress (typographic) printing method, a porous (screen) printing method, a lithographic (offset) printing method, an intaglio (gravure) printing method, a spray printing method and an ink-jet printing method. It is especially preferred that the pattern printing is carried out according to a gravure printing method or a screen printing method. Employing the metal nanowire removing solution in the invention, pattern printing is carried out at a portion of the metal nanowire-containing electroconductive layer in the invention, the portion being unnecessary to form a pattern electrode, followed by washing with water to remove the metal nanowire-containing layer at the portion unnecessary to form a pattern electrode, whereby a pattern electrode can be formed.

[Substrate]

The substrates employed in the present invention are not particularly limited, and material, shape, structure, thickness or hardness thereof may be appropriately selected from those known in the art. Those having a high light transmittance are preferred. Examples of the substrates include films of polyester resins such as polyethylene terephthalate (PET), polyethylene naphthalate or a modified polyester; polyolefin resin films such as a polyethylene (PE) film, a polypropylene (PP) film, a polystyrene film and a cycloolefin resin film; films of vinyl resins such as polyvinyl chloride and polyvinylidene chloride; films of polyvinyl acetal resins such as polyvinyl butyral; a polyether ether ketone (PEEK) resin film; a polysulfone (PSF) resin film; a polyethersulfone (PES) resin film; a polycarbonate (PC) resin film; a polyamide resin film; a polyimide resin film; an acryl resin film; and a triacetyl cellulose (TAC) resin film. A resin film having a transmittance of 80% or more in the visible wavelength regions (380-780 nm) is preferably applicable in the present invention. Particularly, a biaxially oriented polyethylene terephthalate film, a biaxially oriented polyethylene naphthalate film, a polyethersulfone film or a polycarbonate film is preferred from a viewpoint of transparency, heat resistance, easy handling, strength and cost, and a biaxially oriented polyethylene terephthalate film or a biaxially oriented polyethylene naphthalate film is more preferred.

In order to secure the wettability and adhesion property of a coating solution, the substrate used in the present invention can be subjected to surface treatment or provided with an easy adhesion layer. A well-known technique can be used with respect to the surface treatment or the easy adhesion layer. Examples of the surface treatment include surface activating treatments such as corona discharge treatment, flame treatment, ultraviolet treatment, high-frequency wave treatment, glow discharge treatment, activated plasma treatment and laser treatment. Examples of materials for the easy adhesion layer include polyester, polyamide, polyurethane, a vinyl copolymer, a butadiene copolymer, an acryl copolymer, a vinylidene copolymer and an epoxy copolymer. When a film substrate is a biaxially oriented polyethylene terephthalate film and a refractive index of an easy adhesion layer adjacent to the film is from 1.57 to 1.63, it reduces reflection at an interface between the film and the easy adhesion layer and increases transmittance, which is more preferred. Adjustment of a refractive index can be achieved by adjusting suitably a content ratio of an oxide sol with a comparatively high refractive index such as tin oxide sol or cerium oxide sol to a binder resin in a coating solution, and then coating. The easy adhesion layer may be a single layer or may be two or more layers thereof in order to increase adhesion property. A barrier coat layer or a hard coat layer may be beforehand formed on the film substrate, if necessary.

[Pattern Electrode]

It is desirable that the total light transmittance of the pattern portion in the pattern electrode of the present invention is not less than 60%, preferably not less than 70%, and more preferably not less than 80%. The total light transmittance can be determined according to a well-known method employing a spectrophotometer and the like.

The electrical resistance value of the pattern portion in the pattern electrode of the present invention is preferably not more than $10^3 \Omega/\square$, more preferably not more than $10^2 \Omega/\square$, and still more preferably not more than $10 \Omega/\square$ in terms of surface specific resistance. The surface specific resistance can be determined for example, based on JIS K6911, ASTM D257 and the like. Further, it can be easily determined employing a commercially available surface resistance meter.

The pattern electrode of the invention can be provided with an anchor coat or a hard coat. Further, if necessary, an electroconductive layer containing a conductive polymer or metal oxides may be provided or a pattern electrode may be formed by transfer to another substrate.

The pattern electrode of the invention cab be preferably applied to a transparent electrode for an LCD, an electroluminescence element, a plasma display, an electrochromic display, a solar cell or a touch panel; an electronic paper or an electromagnetic wave shielding material.

EXAMPLES

Next, the present invention will be explained employing examples, but the invention is not specifically limited thereto. In the examples, "%" represents "% by mass", unless otherwise specified.

Preparation of Pattern Electrode TCF-1

Comparative Example

Silver nanowires with an average short axis length of 75 nm and an average length of 35 μm as metal particles was prepared employing polyvinyl pyrrolidone K30 with a molecular weight of 50,000 (produced by ISP Co., Ltd.) according to the method described in Adv. Mater., 2002, 14, 833-837, then filtered employing an ultrafiltration membrane, and washed with water to obtain the silver nanowires. The resulting silver nanowires were re-dispersed in ethanol and added with hydroxypropylmethyl cellulose as a binder in an amount of 25% by mass based on the amount of the silver to obtain a silver nanowire dispersion solution.

The silver nanowire dispersion solution was coated onto a polyethylene terephthalate film substrate subjected to adhesion assisting treatment, trade name Cosmoshine A4100 (produced by Toyobo Co., Ltd.), using a spin coater, and dried to form a silver nanowire layer with a coating amount of 0.05 g/m$^2$. Thereafter, the resulting silver nanowire layer was subjected to calendar treatment, and then Pattern) Electrode TCF-1 in the form of stripe, having an electrode pattern with a width of 10 mm, was prepared according to well-known photolithography.

Preparation of Pattern Electrode TCF-2

Comparative Example

A printing plate having a stripe-shaped pattern with a printing pattern width of 10 mm was mounted on a gravure coating machine, K Printing Proofer (produced by MATSUO SANGYO Co., Ltd.), and gravure printing was carried out employing the silver nanowire dispersion solution used in the preparation of TCF-1 above, whose viscosity was adjusted to 1 Pa·s (1000 cP) with sodium carboxymethylcellulose (C5013 produced by SIGMA-ALDRICH Co., Ltd., hereinafter also referred to as CMC), while controlling the printing times so that pattern portions with a silver nanowire coating amount of 0.05 g/m$^2$ were printed on a polyethylene terephthalate film substrate subjected to adhesion assisting treatment, trade name Cosmoshine A4100 (produced by Toyobo Co., Ltd.). Thus, Pattern Electrode TCF-2 in the form of stripe was prepared.

Preparation of Pattern Electrode TCF-3

Inventive Example

<Preparation of Metal Nanowire Removing Solution BF-1>

| | |
|---|---|
| Ferric ammonium ethylenediaminetetraacetate | 60 g |
| Ethylenediaminetetraacetatic acid | 2 g |
| Sodium metabisulfite | 15 g |
| Ammonium thiosulfate | 70 g |
| Maleic acid | 5 g |

Pure water was added to the above composition to make a 1 liter solution and adjusted to a pH of 5.5 with sulfuric acid or aqueous ammonia. Thus, Metal Nanowire Removing Solution BF-1 was prepared.

The silver nanowire dispersion solution used in the preparation of TCF-1 above was coated onto a polyethylene terephthalate film substrate subjected to adhesion assisting treatment, trade name Cosmoshine A4100 (produced by Toyobo Co., Ltd.), using a spin coater, and dried to form a silver nanowire layer with a coating amount of 0.05 g/m$^2$. Thereafter, the resulting silver nanowire layer was subjected to calendar treatment. A printing plate having a stripe-shaped pattern with a printing pattern width of 10 mm was mounted on a gravure coating machine, K Printing Proofer (produced by MATSUO SANGYO Co., Ltd.), and gravure printing was carried out employing a metal nanowire removing solution, which was prepared by adjusting the viscosity of Metal Nanowire Removing Solution BF-1 to 0.5 Pa·s (500 cP) with CMC, while controlling the printing times so that the metal nanowire removing solution was coated on the silver nanowire layer to give a coating layer thickness of 30 μm. After printing, the resulting printed material was allowed to stand for 1 minute, and then washed with flowing water. Thus, Pattern Electrode TCF-3 in the form of stripe was prepared.

Preparation of Pattern Electrode TCF-4

Inventive Example

Printing was carried out in the same manner as in Pattern Electrode TCF-3 so that the metal nanowire removing solution was coated on the silver nanowire layer to give a coating layer thickness of 30 μm, except that instead of gravure printing, screen printing was carried out employing a polyester mesh for screen printing (255T produced by Mitani Micronics Co., Ltd.) having a 10 mm stripe-shaped pattern and a metal nanowire removing solution, which was prepared by adjusting the viscosity of the Metal nanowire Removing Solution BF-1 prepared in TCF-3 to 10 Pa·s (10000 cP) with CMC. After printing, the resulting printed material was allowed to stand for 1 minute, and then washed with flowing water. Thus, Pattern Electrode TCF-4 in the form of stripe was prepared.

Preparation of Pattern Electrode TCF-5

Inventive Example

Printing was carried out in the same manner as in Pattern Electrode TCF-3, except that instead of gravure printing, ink jet printing was carried out employing an ink jet printer and a metal nanowire removing solution which was prepared by adjusting the viscosity of the Metal Nanowire Removing Solution BF-1 prepared in TCF-3 to 30 mPa·s (30 cP) with CMC, while controlling the printing times, so that the metal nanowire removing solution was coated on the silver nanowire layer to give a coating layer thickness of 30 μm and to form a 10 mm stripe-shaped pattern. After printing, the resulting printed material was allowed to stand for 1 minute, and then washed with flowing water. Thus, Pattern Electrode TCF-5 in the form of stripe was prepared.

Preparation of Pattern Electrode TCF-6

Inventive Example

Before the silver nanowire dispersion solution was coated in the preparation of TCF-4, an epoxy based binder cross linking agent EX512 (produced by Nagase ChemteX Corporation) was undercoated to give an amount of 10% of the binder content by mass of the silver nanowire dispersion solution. Subsequently, the silver nanowire dispersion solution was coated on the undercoat, subjected to heat treatment at 120° C. for 30 minutes to form a silver nanowire coating layer. Then, a conductive polymer coating solution was overcoated on the silver nanowire coating layer so that the silver nanowires were almost completely buried in the coating layer, and subjected to heat treatment at 120° C. for 30 minutes. The conductive polymer coating solution was prepared by adding to a conductive polymer dispersion solution of PEDOT:PSS (polystyrene sulfonic acid) (=1:2.5), Baytron PH510 (produced by H.C. Starck Co., Ltd.), PVA 245 (produced by Kuraray Co., Ltd.) as a binder in the same amount as the conductive polymer and a cross linking agent FX512 in an amount of 10% of the binder content by mass. Thereafter, in a similar manner as in TCF-4, screen printing was carried out employing a polyester mesh for screen printing (255T produced by Mitani Micronics Co., Ltd.) having a 10 mm stripe-shaped pattern, and a metal nanowire removing solution, which was prepared by adjusting the viscosity of the Metal Nanowire Removing Solution BF-1 to 10 Pa·s (10000 cP) with CMC, was coated on the silver nanowire coating layer to give a coating layer thickness of 30 μm. After printing, the resulting printed material was allowed to stand for 1 minute, and then washed with flowing water. Thus, Pattern Electrode TCF-6 in the form of stripe was prepared.

Preparation of Pattern Electrode TCF-7

Inventive Example

A Pattern Electrode TCF-7 in the form of stripe was prepared in the same manner as in TCF-3, except that pattern printing was carried out employing a metal nanowire removing solution prepared by adjusting the viscosity of the Metal Nanowire Removing Solution BF-1 to 0.5 Pa·s (500 cP) with a viscosity increasing agent Aerosil #200 (silica particles, produced by Nippon Aerosil Co., Ltd.), and then removal and washing of the unnecessary silver nanowire layer was carried out.

Preparation of Pattern Electrode TCF-8

Inventive Example

A Pattern Electrode TCF-8 in the form of stripe was prepared in the same manner as in TCF-3, except that pattern printing was carried out employing a metal nanowire removing solution prepared by adjusting the viscosity of a Metal Nanowire Removing Solution BF-2 prepared as described below to 0.5 Pa·s (500 cP) with CMC, and then removal and washing of the unnecessary silver nanowire layer was carried out.
<Preparation of Metal Nanowire Removing Solution BF-2>
Metal Nanowire Removing Solution BF-2 was prepared in which sulfuric acid in an amount of 5% by mass and ferric sulfate in an amount of 10% by mass were contained in pure water as a solvent.
<<Evaluation of Pattern) Electrode>>
The surface specific resistance and light transmittance of pattern electrodes 1 through 8 were determined according to the following method.
(Surface Specific Resistance)
The surface specific resistance was measured by means of a resistivity measurement meter Loresta GP produced by Dia Instruments Co., Ltd., and the surface specific resistance at the pattern portions in the form of stripe was measured employing a four terminal method.
(Light Transmittance)
With respect to light transmittance, the total light transmittance of the pattern portions in the form of stripe was determined through AUTOMATIC HAZE MEIER (MODEL TC-HIIIDP) produced by Tokyo Denshoku Co., Ltd.
The results are shown in Table 1.

TABLE 1

| Pattern Electrode No. | Silver Nanowires | Metal Nanowire Removing Solution | Water Soluble Binder | Pattern Forming Method | Light Transmittance (%) | Surface Specific Resistance (Ω/□) | Remarks |
|---|---|---|---|---|---|---|---|
| TCF-1 | (a) | Not used | None | *1 | 73 | 35 | Comp. |
| TCF-2 | (b) | Not used | None | *2 | 81 | 79 | Comp. |
| TCF-3 | (a) | BF-1 | CMC | *3 | 84 | 10 | Inv. |
| TCF-4 | (a) | BF-1 | CMC | *4 | 84 | 10 | Inv. |
| TCF-5 | (a) | BF-1 | CMC | *5 | 84 | 10 | Inv. |
| TCF-6 | (c) | BF-1 | CMC | *4 | 82 | 11 | Inv. |

TABLE 1-continued

| Pattern Electrode No. | Silver Nanowires | Metal Nanowire Removing Solution | Water Soluble Binder | Pattern Forming Method | Light Transmittance (%) | Surface Specific Resistance (Ω/□) | Remarks |
|---|---|---|---|---|---|---|---|
| TCF-7 | (a) | BF-1 | Aerosil #200 | *3 | 80 | 10 | Inv. |
| TCF-8 | (a) | BF-2 | CMC | *3 | 84 | 13 | Inv. |

Comp.: Comparative,
Inv.: Inventive
(a): The silver nanowires were coated on the entire surface of the substrate.
(b): Line patterns of the silver nanowires were coated on the surface of the substrate.
(c): The silver nanowires were coated on the entire surface of the substrate, followed by over-coating of the conductive polymer.
*1: Non-electrode pattern portions were removed according to photolithography.
*2: The silver nanowires were coated on the electrode pattern portions via a gravure printing method.
*3: The metal nanowire removing solution was coated on the non-electrode pattern portions via a gravure printing.method.
*4: The metal nanowire removing solution was coated on the non-electrode pattern portions via a screen printing method.
*5: The metal nanowire removing solution was coated on the non-electrode pattern portions via an ink jet printing method.

As is apparent from Table 1, the inventive pattern electrodes excel in electroconductivity (specific surface resistance) and transparency (light transmittance).

The invention claimed is:

1. A method of manufacturing a pattern electrode, the method comprising the steps of:
forming on a substrate an electroconductive layer containing metal nanowires; and
carrying out pattern printing on the electroconductive layer employing a metal nanowire removing solution comprising a bleach-fixing solution to form a metal nanowire removing pattern at a portion of the electroconductive layer unnecessary to form a pattern electrode, followed by washing with water to remove the electroconductive layer at the portion where the metal nanowire removing pattern has been formed, thereby forming a pattern electrode on the substrate.

2. The method of manufacturing a pattern electrode of claim 1, wherein the metal nanowires are silver nanowires.

3. The method of manufacturing a pattern electrode of claim 1, wherein the metal nanowire removing solution contains a water soluble binder.

4. The method of manufacturing a pattern electrode of claim 1, wherein the pattern printing is carried out employing a gravure printing method.

5. The method of manufacturing a pattern electrode of claim 1, wherein the pattern printing is carried out employing a screen printing method.

6. The method of manufacturing a pattern electrode of claim 1, wherein the bleach-fixing solution contains a bleaching agent and a fixing agent.

7. The method of manufacturing a pattern electrode of claim 6, wherein the bleaching agent comprises an organic complex salt of iron (III).

8. The method of manufacturing a pattern electrode of claim 7, wherein the organic complex salt of iron (III) comprises an iron (III)-aminopolycarboxylic acid complex salt.

9. The method of manufacturing a pattern electrode of claim 8, wherein the aminopolycarboxylic acid is selected from the group consisting of ethylenediamine disuccinic acid (an SS isomer), N-(2-carboxylatoethyl)-L-aspartic acid, β-alanine diacetic acid, methylimino diacetic acid, ethylenediamine tetraacetic acid, diethylenetriamine pentaacetic acid, 1,3-diaminopropane tetraacetic acid, propylenediamine tetraacetic acid, nitrilotriacetic acid, cyclohexanediamine tetraacetic acid, imino diacetic acid, and glycol ether diamine tetraacetic acid.

10. The method of manufacturing a pattern electrode of claim 6, wherein the fixing agent comprises a thiosulfate.

11. The method of manufacturing a pattern electrode of claim 10, wherein the thiosulfate is ammonium thiosulfate.

12. The method of manufacturing a pattern electrode of claim 3, wherein the water soluble binder comprises sodium carboxymethylcellulose.

* * * * *